United States Patent
Koty et al.

(10) Patent No.: US 11,258,012 B2
(45) Date of Patent: Feb. 22, 2022

(54) OXYGEN-FREE PLASMA ETCHING FOR CONTACT ETCHING OF RESISTIVE RANDOM ACCESS MEMORY

(71) Applicants: Tokyo Electron Limited, Tokyo (JP); International Business Machines Corporation, Armonk, NY (US)

(72) Inventors: Devi Koty, Albany, NY (US); Qingyun Yang, Albany, NY (US); Hiroyuki Miyazoe, Armonk, NY (US); Takashi Ando, Armonk, NY (US); Eduard Cartier, Armonk, NY (US); Vijay Narayanan, Armonk, NY (US); Sebastian Ulrich Englemann, Armonk, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 54 days.

(21) Appl. No.: 16/385,179

(22) Filed: Apr. 16, 2019

(65) Prior Publication Data
US 2020/0203607 A1 Jun. 25, 2020

Related U.S. Application Data

(60) Provisional application No. 62/781,729, filed on Dec. 19, 2018.

(51) Int. Cl.
*H01L 45/00* (2006.01)
*H01L 27/24* (2006.01)

(52) U.S. Cl.
CPC ...... *H01L 45/1675* (2013.01); *H01L 27/2436* (2013.01); *H01L 27/2463* (2013.01);
(Continued)

(58) Field of Classification Search
CPC ............... H01L 45/146; H01L 27/2436; H01L 45/1233; H01L 45/1675; H01L 45/08; H01L 27/2463; H01L 21/31116; H01L 27/228; H01L 29/6653; H01L 29/6656; H01L 43/12; H01L 45/04; H01L 45/085;
(Continued)

(56) References Cited

U.S. PATENT DOCUMENTS 9,735,358 B2 8/2017 Jo et al.
10,050,197 B2 8/2018 Tu et al.
(Continued)

*Primary Examiner* — Sonya McCall-Shepard
(74) *Attorney, Agent, or Firm* — Weihrouch IP

(57) ABSTRACT

A resistive random access memory (RERAM) apparatus and method for forming the apparatus are provided. Oxygen content control in the RERAM is provided. To provide oxygen content control, a via to an electrode of the RERAM is formed utilizing an oxygen-free plasma etch step. In one embodiment, the dielectric within which the via is formed is silicon nitride (SiN). In exemplary embodiments, the plasma chemistry is a hydrofluorocarbon ($C_xH_yF_z$)-based plasma chemistry or a fluorocarbon ($C_xF_y$)-based plasma chemistry. In one embodiment, the resistive layer of the RERAM is a metal oxide. In another embodiment, the oxygen concentrations in the electrode of the RERAM under the via and outside the via are the same after formation of the via.

20 Claims, 10 Drawing Sheets

(52) U.S. Cl.
CPC .......... *H01L 45/08* (2013.01); *H01L 45/1233* (2013.01); *H01L 45/1253* (2013.01); *H01L 45/146* (2013.01)

(58) Field of Classification Search
CPC . H01L 45/12; H01L 45/1266; H01L 45/1616; H01L 27/24–249; H01L 45/145–147; H01L 45/16–1691; H01L 21/3065–30655; H01L 21/31138; H01L 21/67069; H01L 21/32136–32137; H01L 21/02071; H01L 23/535; H01L 21/74; H01L 23/481; H01L 2225/06541–06544; H01L 2225/06548; H01L 21/76898; H01L 2224/29009; H01L 2224/29025; H01L 21/76802–76817; H01L 21/76877–76883; H01L 45/1253–1273; H01L 27/2481–249; G11C 2213/52; G11C 2213/81–82
See application file for complete search history.

(56) References Cited

U.S. PATENT DOCUMENTS

| | | | |
|---|---|---|---|
| 10,164,181 B2 | 12/2018 | Yang et al. | |
| 2011/0272664 A1* | 11/2011 | Tada | H01L 45/04 257/4 |
| 2013/0105916 A1* | 5/2013 | Chang | H01L 21/31116 257/410 |
| 2015/0357200 A1* | 12/2015 | Inui | H01L 21/31116 438/706 |
| 2019/0123273 A1* | 4/2019 | Lee | H01L 45/08 |
| 2019/0214559 A1* | 7/2019 | Clarke | H01L 45/1253 |

* cited by examiner

OXYGEN-FREE PLASMA ETCHING FOR CONTACT ETCHING OF RESISTIVE RANDOM ACCESS MEMORY

This application claims priority to U.S. Provisional Patent Application No. 62/781,729, entitled, "Oxygen-Free Plasma Etching For Contact Etching of Resistive Random Access Memory" filed Dec. 19, 2018; the disclosure of which is expressly incorporated herein, in its entirety, by reference.

BACKGROUND

The present disclosure relates to the processing of substrates. In particular, it provides a method of etching layers on substrates.

A resistive random access memory (RMAM or ReRAM) is a type of non-volatile random access memory that operates by changing the resistance across a dielectric material. RERAMs are being considered for a variety of memory applications including for electronic synapse devices, memristors for neuromorphic computing, high-density and high-speed non-volatile memory, and other applications.

The resistive characteristics of the cell dielectric material utilized to form the RERAM cell are important factors in the performance of the RERAM cell. For some dielectric materials utilized in RERAMs, the oxygen vacancy in the dielectric material is an important factor providing the desired resistance across the dielectric. One such dielectric material is hafnium oxide (HfO). In such materials, it is important to control the oxygen content of the resistive material. One such control technique is to encapsulate the RERAM cell with non-oxygen-containing dielectric material. Thus, for example, in one embodiment, the RERAM cell is encapsulated within a silicon nitride (SiN) dielectric. It will be recognized, however, that other non-oxygen-containing dielectrics may be utilized for such encapsulation so as to control the oxygen content of the RERAM cell materials.

FIG. 1 illustrates an exemplary RERAM cell 105. In the example of FIG. 1, the cell memory dielectric 110 is comprised of an HfO layer. Further the RERAM cell 105 includes top electrode 115 and bottom electrode 120, both formed of titanium nitride (TiN). As shown, dielectric surrounding the cell memory dielectric and electrodes is a first SiN layer 142, a non-oxygen-containing dielectric. Dielectric layer 140A, dielectric layer 140B, dielectric layer 140C, tungsten layer 150, additional SiN layer 147, metal layer 155, top electrode via conductor 165, and second via conductor 160 are also provided as shown. The top electrode via conductor 165 connects the metal layer 155 to the top electrode 115. It will be recognized that the materials, layouts and configurations of FIG. 1 are merely exemplary and that RERAMs may be formed of other materials and have other structural configurations, as is well known in the art.

It would be desirable to provide an improved process for forming a RERAM by improving the control of oxygen vacancies in the RERAM cell.

SUMMARY

A method for improving the oxygen content control in an RERAM is provided. It has been found that the etch process utilized to form contact vias to electrodes of the RERAM cell can impact the control of oxygen vacancies in the memory cell. For example, typical etch processes utilized to etch the dielectric within which the via is formed often include oxygen species in the etch. The inclusion of such oxygen species has been found to impact the oxygen content of the memory cell and accordingly the resistive characteristics of the memory cell. Specifically, oxygen-containing plasmas result in an increase of the RERAM forming voltage. In one embodiment, the dielectric within which the via is etched is SiN and common highly selective SiN plasma etches include an oxygen-containing chemistries. According to the techniques described herein, an oxygen-free via etch process is provided. Thus, in one embodiment, a via is etched within a SiN layer by utilizing an oxygen-free plasma etch chemistry. In exemplary embodiments, the plasma chemistry is a hydrofluorocarbon ($C_xH_yF_z$)-based plasma chemistry or a fluorocarbon ($C_xF_y$)-based plasma chemistry, though other chemistries may be used.

In one embodiment, the plasma chemistry utilized to etch a contact via through a SiN dielectric to an electrode of an RERAM cell includes $C_4H_9F$-based plasma. Other potential hydrofluorocarbons and fluorocarbons include, but are not limited to, $CH_3F$, $C_4F_6$, $C_4F_8$, $CF_4$, and/or $CHF_3$. The plasma gases may also be optionally mixed with hydrogen ($H_2$), nitrogen ($N_2$), argon (Ar), ammonia ($NH_3$) or other gases to provide the desired etch characteristics. In one embodiment, the plasma etch chemistry includes $C_4H_9F$, $H_2$, and Ar.

In a first embodiment, a method of forming a resistive random access memory (RERAM) structure is disclosed. The method may comprise providing a first RERAM electrode layer, providing a second RERAM electrode layer, providing a RERAM resistive dielectric layer between the first RERAM electrode layer and the second RERAM electrode layer and providing a first dielectric layer overlying the second RERAM electrode layer. The method further comprises utilizing an oxygen-free plasma etch to etch at least a portion of the first dielectric layer so as to expose a portion of the second RERAM electrode as part of a process to form a via in the first dielectric layer so as to provide a region for making electrical contact to the second RERAM electrode, wherein utilizing the oxygen-free plasma etch controls oxygen vacancies in the RERAM.

In some alternative embodiments of the first embodiment, the RERAM resistive dielectric layer comprises hafnium oxide (HfO). Other materials may be utilized for the RERAM resistive dielectric layer, including but not limited to metal oxides that can comprise a material selected from a group of materials comprising Hafnium Oxide (HfOx), Tantalum Oxide (TaOx), Alminum Oxide (AlOx), Zirconium Oxide (ZrOx) and Titanium Oxide (TiOx) and their mixtures. In some alternative embodiments, the first dielectric layer comprising silicon nitride. In other alternative embodiments, the oxygen-free plasma etch is a hydrofluorocarbon or fluorocarbon-based plasma etch. In some embodiments, the oxygen-free plasma etch is a hydrofluorocarbon-based plasma etch. In some embodiments, the hydrofluorocarbon comprises $C_4H_9F$.

In a second embodiment, a method of forming a resistive random access memory (RERAM) structure is disclosed. The method includes providing a first RERAM electrode layer, providing a second RERAM electrode layer and providing a RERAM resistive dielectric layer between the first RERAM electrode layer and the second RERAM electrode layer. The method further comprises encapsulating at least a portion of the first RERAM electrode layer, the second RERAM electrode layer and the RERAM resistive dielectric layer with a first dielectric. The method also includes etching a via through the first dielectric so as to expose a first portion of the second RERAM electrode layer, the etching performed in a manner so that the first portion of the second RERAM electrode layer is subjected to an oxygen-free plasma etch, the oxygen-free plasma etch being a hydrofluorocarbon or fluorocarbon-based plasma etch.

In some alternative embodiments of the second embodiment, the first dielectric comprises a silicon nitride. In some embodiments, the oxygen-free plasma etch is a hydrofluorocarbon-based plasma etch. In some embodiments, the hydrofluorocarbon comprises $C_4H_9F$. In other alternative embodiments, a first oxygen concentration in the first portion of the second RERAM electrode layer is the same as a second oxygen concentration in second portions of the second RERAM electrode layer, the second portions of the second RERAM electrode layer not being exposed to the oxygen-free plasma etch. In still alternative embodiments, the RERAM resistive layer comprises hafnium oxide (HfO). The RERAM resistive layer that received the oxygen-free plasma etch has an oxygen vacancy concentration higher than that in the RERAM resistive layer that received oxygen-containing plasma etch.

In a third embodiment, a resistive random access memory (RERAM) structure is disclosed. The structure comprises a first RERAM electrode layer, a second RERAM electrode layer and a RERAM resistive dielectric layer between the first RERAM electrode layer and the second RERAM electrode layer. The structure further comprises a first dielectric layer overlying the second RERAM electrode and a via region formed in the first dielectric layer. The structure also comprises a first region of the second RERAM electrode layer, the first region of the second RERAM electrode layer aligned with the via region, the first region of the second RERAM electrode layer having a first oxygen concentration. The structure further comprises a second region of the second RERAM electrode layer, the second region of the second RERAM electrode layer not underlying the via region, the second region of the second RERAM electrode layer having a second oxygen concentration, wherein the first oxygen concentration is the same as the second oxygen concentration.

In some alternative embodiments of the third embodiment, the first dielectric layer comprises silicon nitride. In other alternative embodiments, the resistive dielectric layer comprises hafnium oxide (HfO). Other materials may be utilized for the RERAM resistive dielectric layer, including but not limited to metal oxides that can comprise a material selected from a group of materials comprising Hafnium Oxide (HfOx), Tantalum Oxide (TaOx), Alminum Oxide (AlOx), Zirconium Oxide (ZrOx) and Titanium Oxide (TiOx) and their mixtures. In some alternative embodiments, the RERAM further comprises a second dielectric layer, the via region formed in both the first dielectric layer and the second dielectric layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A method for improving the oxygen content control in an RERAM is provided. It has been found that the etch process utilized to form contact vias to electrodes of the RERAM cell can impact the control of oxygen vacancies in the memory cell. For example, typical etch processes utilized to etch the dielectric within which the via is formed often include oxygen species in the etch. The inclusion of such oxygen species has been found to impact the oxygen content of the memory cell and accordingly the resistive characteristics of the memory cell. Specifically, oxygen-containing plasmas result in an increase of the RERAM forming voltage. In one embodiment, the dielectric within which the via is etched is SiN and common highly selective SiN plasma etches include an oxygen-containing chemistries. According to the techniques described herein, an oxygen-free via etch process is provided. Thus in one embodiment, a via is etched within a SiN layer by utilizing an oxygen-free plasma etch chemistry. In exemplary embodiments, the plasma chemistry is a hydrofluorocarbon ($C_xH_yF_z$)-based plasma chemistry or a fluorocarbon ($C_xF_y$)-based plasma chemistry, though other chemistries may be used.

In one embodiment, the plasma chemistry utilized to etch a contact via through a SiN dielectric to an electrode of an RERAM cell includes $C_4H_9F$-based plasma. Other potential hydrofluorocarbons and fluorocarbons include, but are not limited to, $CH_3F$, $C_4F_6$, $C_4F_8$, $CF_4$, and/or $CHF_3$. The plasma gases may also be optionally mixed with hydrogen ($H_2$), nitrogen ($N_2$), argon (Ar), ammonia ($NH_3$) or other gases to provide the desired etch characteristics. In one embodiment, the plasma etch chemistry includes $C_4H_9F$, $H_2$, and Ar.

The techniques described herein to protect the oxygen content integrity of an RERAM cell may be utilized with a wide range of RERAM cell designs, RERAM cell memory dielectrics, RERAM encapsulation dielectrics, and RERAM process flows. It will be recognized that RERAM cell designs, RERAM cell memory dielectrics, RERAM encapsulation dielectrics, and RERAM process flows shown herein are merely exemplary and those skilled in the art will recognize many other alternatives may still obtain the advantages of the techniques described herein. One exemplary process flow and RERAM cell design is shown in FIGS. 2A-2M. However, other process flows and RERAM cell designs may be utilized.

Figure 1:
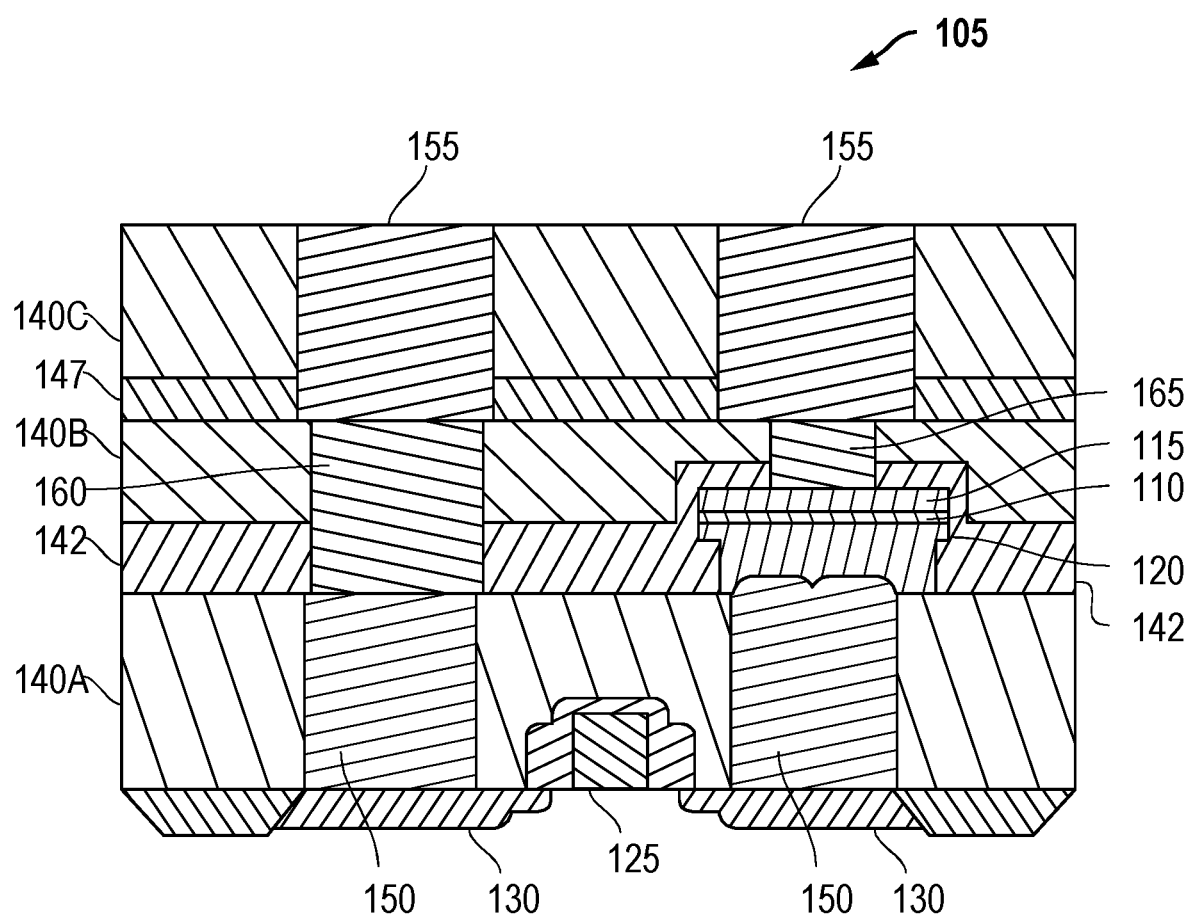
FIG. 1 illustrates an exemplary RERAM cell configuration.
Figure 2A:
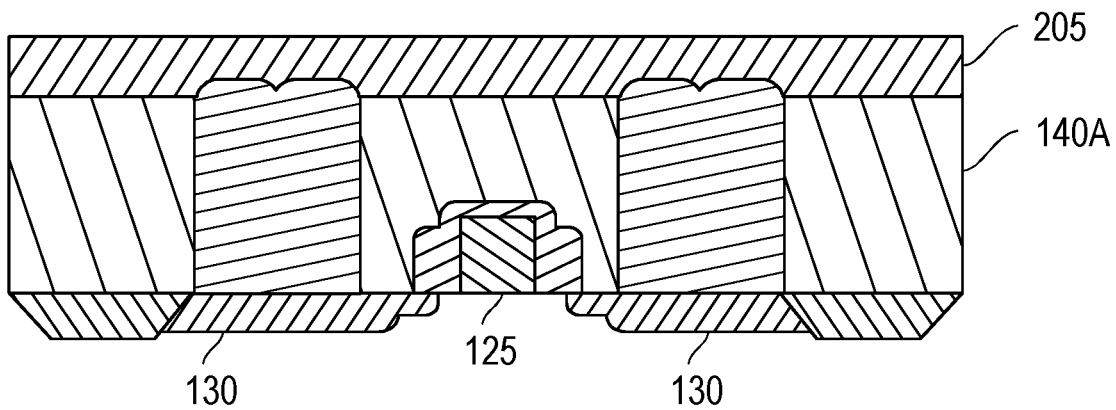
FIGS. 2A-2M illustrate one exemplary process flow and RERAM cell design in which the techniques described herein may be utilized.

As shown in FIG. 2A a partially completed RERAM cell is illustrated. The RERAM cell may be provided on a substrate utilizing any of a wide variety of substrate processing techniques to achieve the structure shown. The substrates utilized with the techniques disclosed herein may be any substrates for which the etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

Figure 2B:
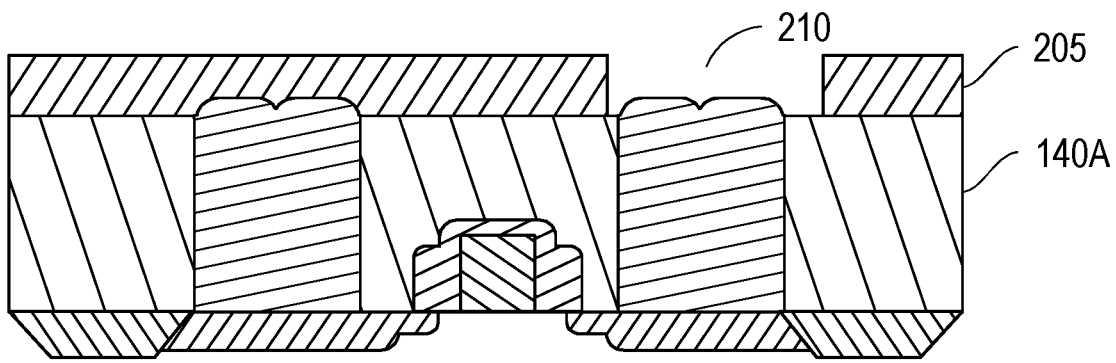
Figure 2C:
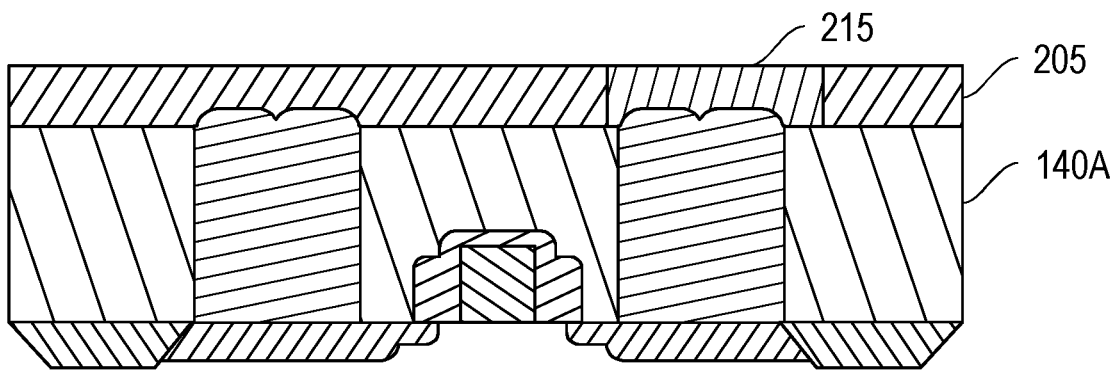

As shown in FIG. 2A, the RERAM cell gate 125, source/drains 130, and tungsten layer 150 plugs, and an SiN over layer 205 have been formed. The various conductor layers and vias may further include a barrier conductor as is known in the art. In one embodiment, TiN may be utilized as a barrier conductor. However, it will be recognized that a wide range of metallization layer(s) may be utilized as the barrier conductor, as is well known in the art. As shown in FIGS. 2B and 2C, a bottom electrode via 210 of the SiN over layer 205 may be etched and the via then filled with a conductive material, for example TiN, to form a conductor 215.

Figure 2D:
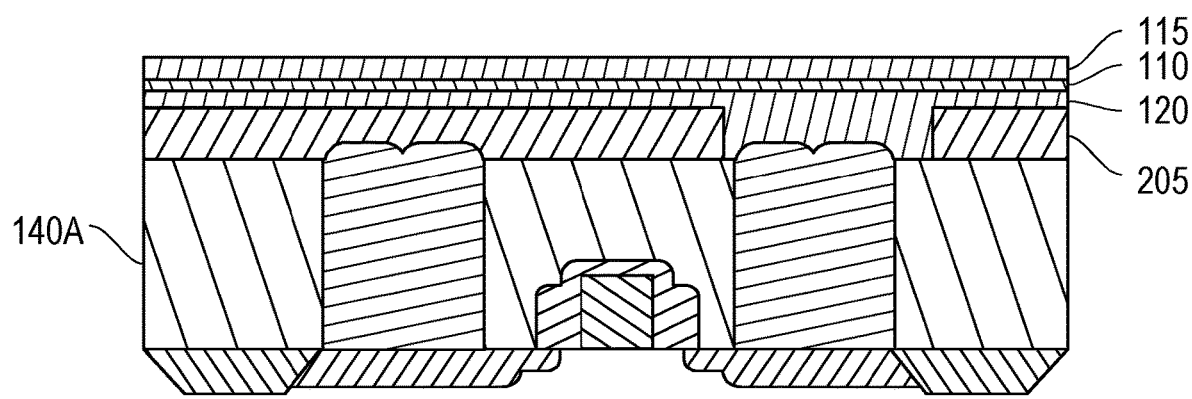
Figure 2E:
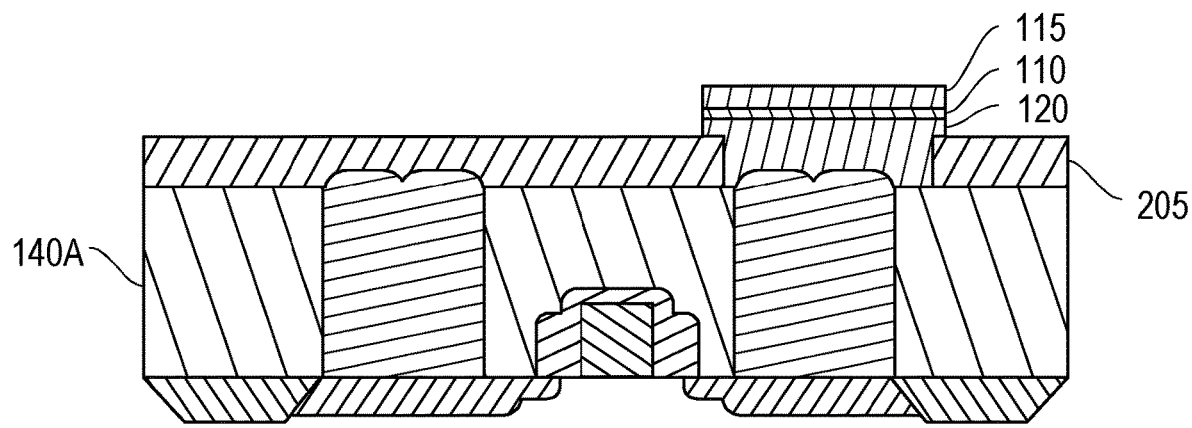
Figure 2F:
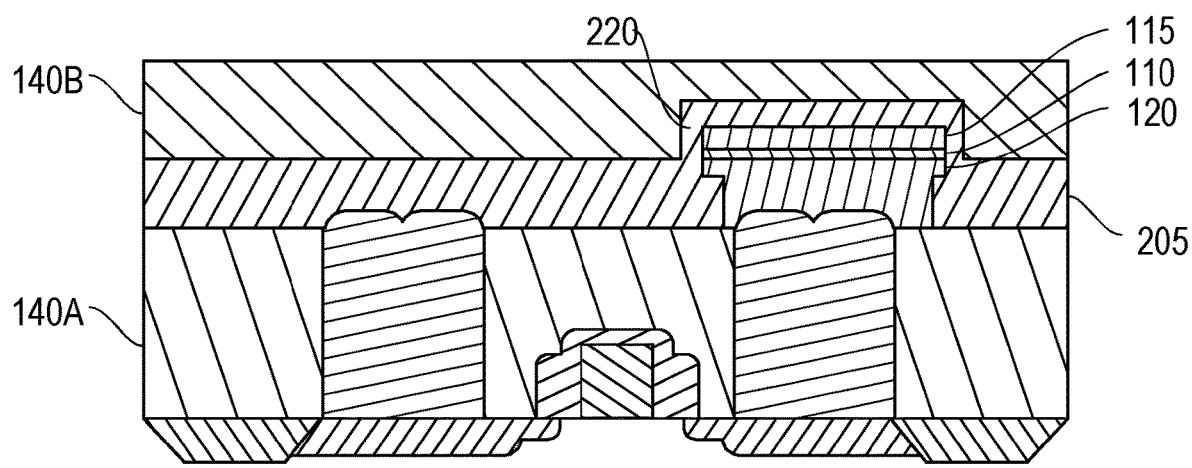

Next, the layers of the RERAM cell stack comprised of a bottom electrode 120, cell memory dielectric 110 and top electrode 115 may be formed as shown in FIG. 2D. In another embodiment, the bottom electrode 120 is omitted. The following descriptions and figures only use the structure with the bottom electrode 120 for simplicity of demonstration. In one embodiment, the top electrode 115 and bottom electrode 120 may both be formed of TiN. In one embodiment, the cell memory dielectric 110 may be formed of HfO. It will be recognized, however, that other materials may be utilized. Next, the cell stack may be patterned as shown in FIG. 2E. Then an encapsulation dielectric 220 (in this example SiN) may be utilized to surround the cell stack followed by the formation of dielectric layer 140B as shown in FIG. 2F.

Figure 2G:
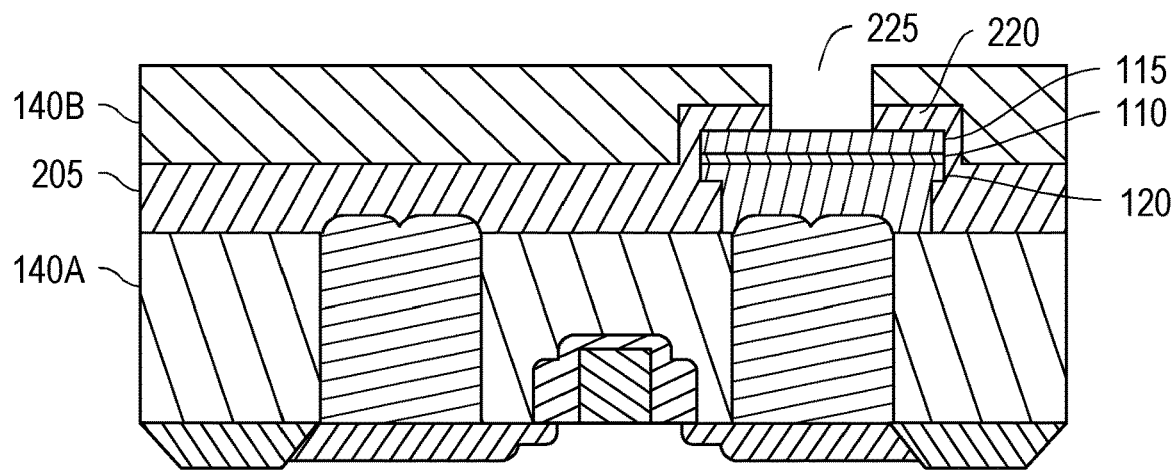
Figure 2H:
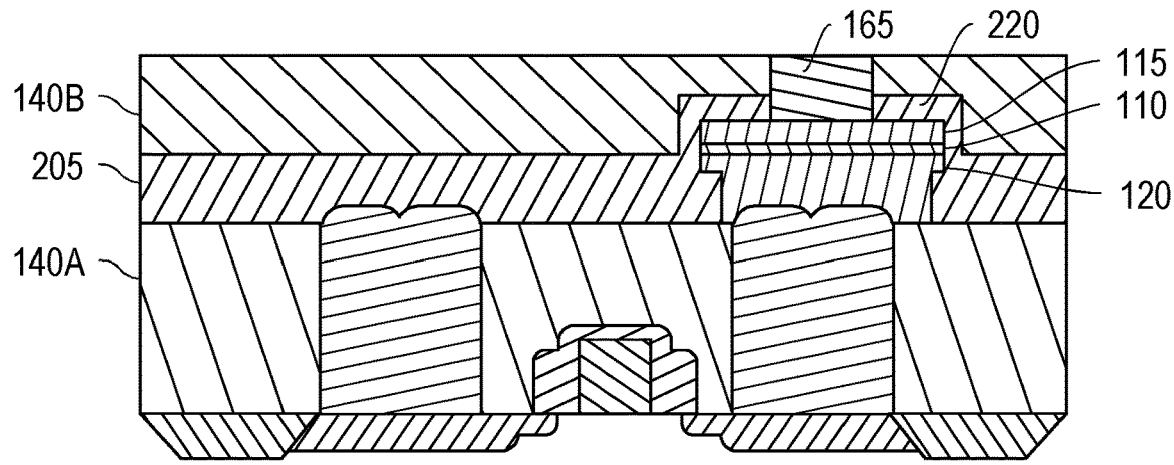

A top electrode via 225 may then be etched in the dielectric layer 140B and the encapsulation dielectric 220 as shown in FIG. 2G. A variety of etch processes may be utilized to etch the top dielectric layer as would be known in the art. At least a portion of the encapsulation dielectric (SiN) may be etched with an oxygen-free etch chemistry as described herein. In this manner, the impact of the via etch on oxygen vacancies in the resistive cell memory dielectric 110 (in this example HfO) may be minimized. The top electrode via 225 may then be filled with a conductor, for example copper or tungsten, to form the top electrode via conductor 165 as shown in FIG. 2H. As mentioned above, a barrier metallization layer may be utilized with the various conductive layers, in one example TiN.

Figure 2I:
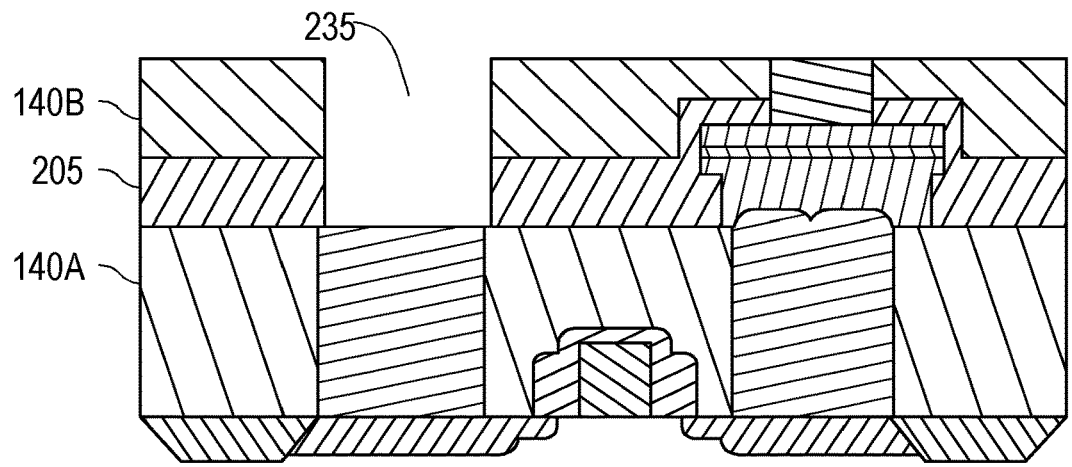
Figure 2J:
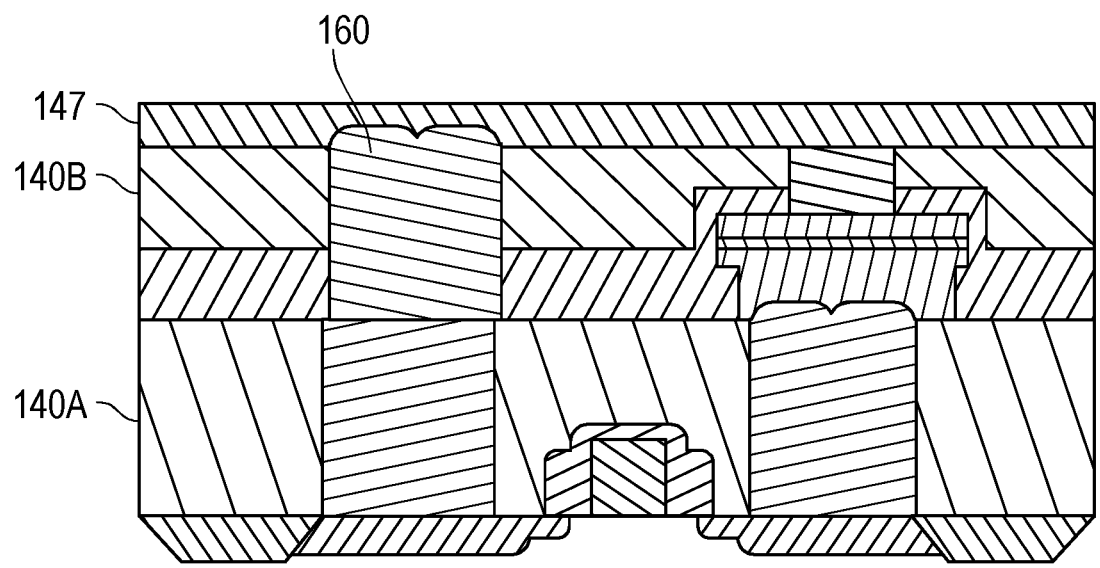
Figure 2K:
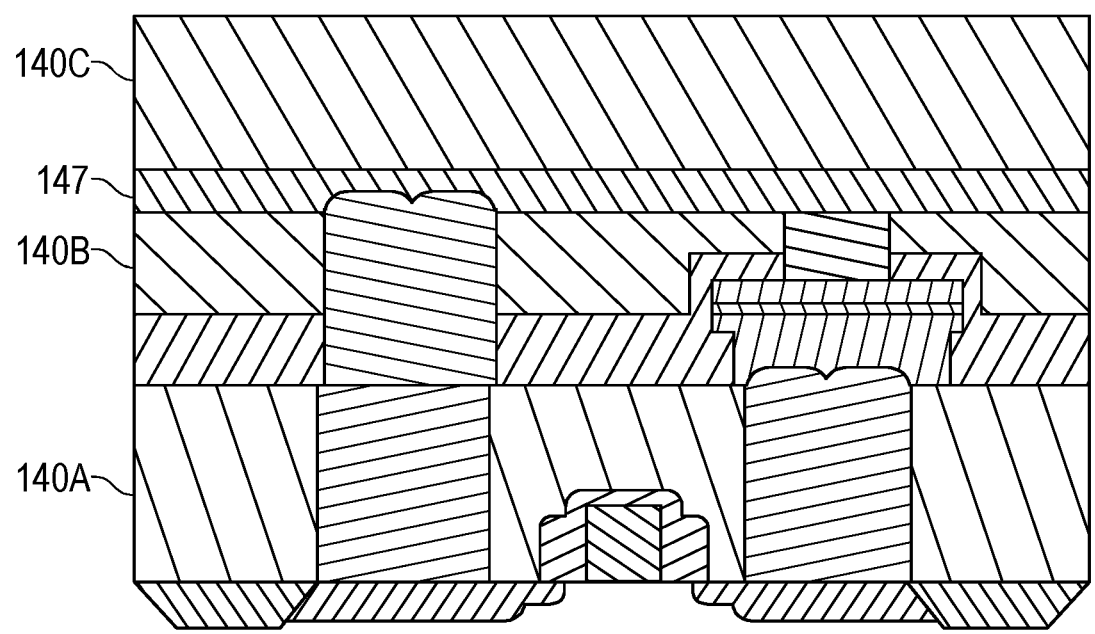
Figure 2L:
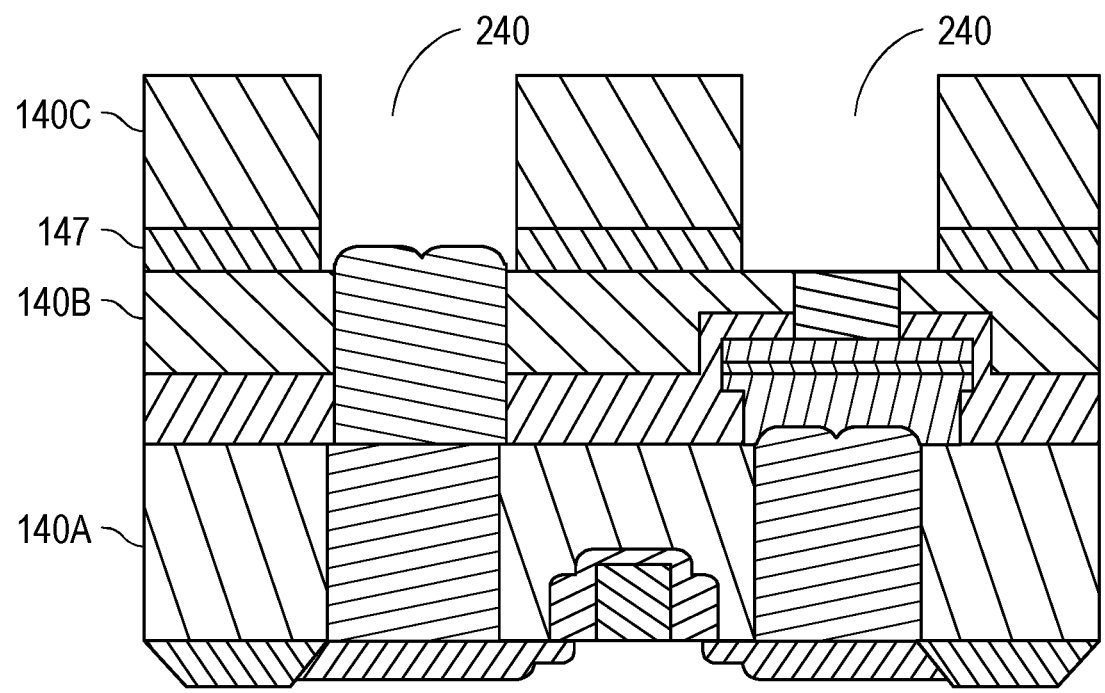
Figure 2M:
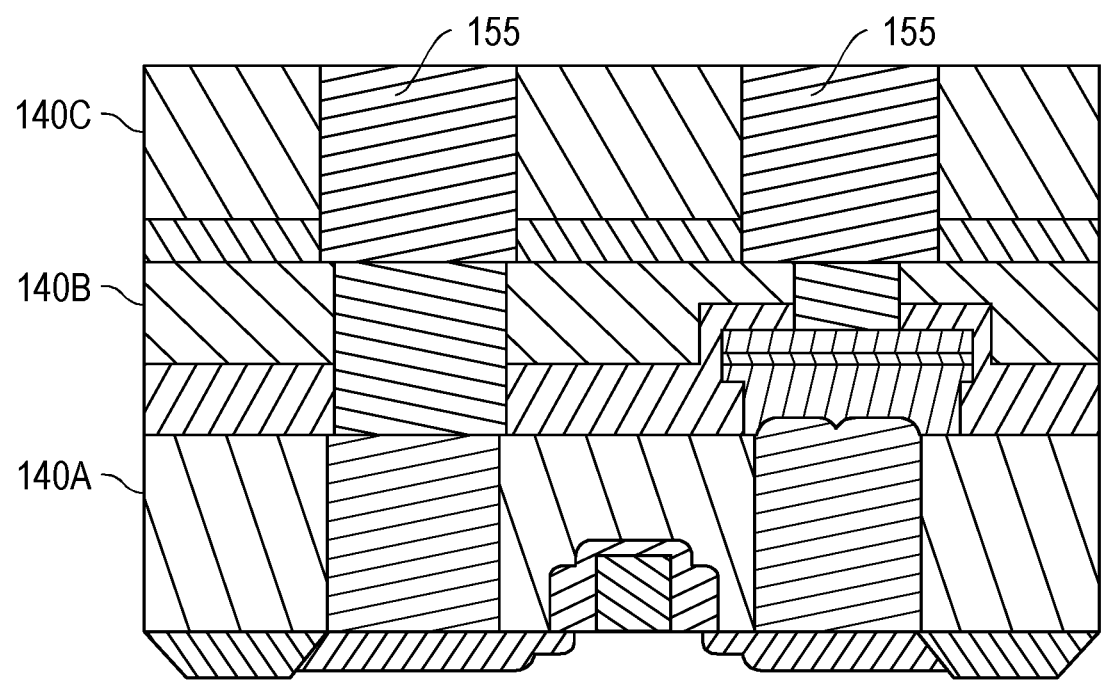

The RERAM cell formation may be completed as shown in FIGS. 2I and 2J by forming a second via 235, second via conductor 160 and additional SiN layer 147. Then a damascene metallization process may be provided to make electrical contact to the RERAM cell as shown in FIGS. 2K, 2L, and 2M. More specifically, dielectric layer 140C is provided, trenches 240 are formed, and then the trenches 240 are filled with metal layer 155 as shown.

As mentioned above, the plasma utilized to etch the encapsulation dielectric, as shown in FIG. 2G above, may include an oxygen-free plasma chemistry. In one embodiment, the encapsulation dielectric is SiN and the plasma chemistry utilized is $C_4H_9F$, $H_2$, and Ar. It will be recognized that the plasma process tool utilized may be any of a wide range of plasma etch tools. For example, the etch tool may be an inductively coupled plasma (ICP) etch tool, a capacitively coupled plasma (CCP) etch tool, a microwave plasma etch tool, or other etch tools.

In one embodiment, the process conditions for the plasma etch of the encapsulation layer may be gas flows of 5-50 standard cubic centimeters per minute (SCCM) $C_4H_9F$, 0-50 SCCM $H_2$, and 20-300 SCCM Ar; pressure 50-200 milliTorr (mT); and microwave (MW) power settings of source power 500-2000 W and bottom electrode radio frequency (RF) bias of 20-100 W. The use of such conditions may provide selectively of greater than 10:1 between SiN and various common materials such as oxides, polysilicon, metal layers, and organic planarization layers (a selectivity comparable to common oxygen including SiN-based etches). Furthermore, such an etch minimizes the impact of the etch on the electrical characteristics of the RERAM cell stack.

Figure 3:
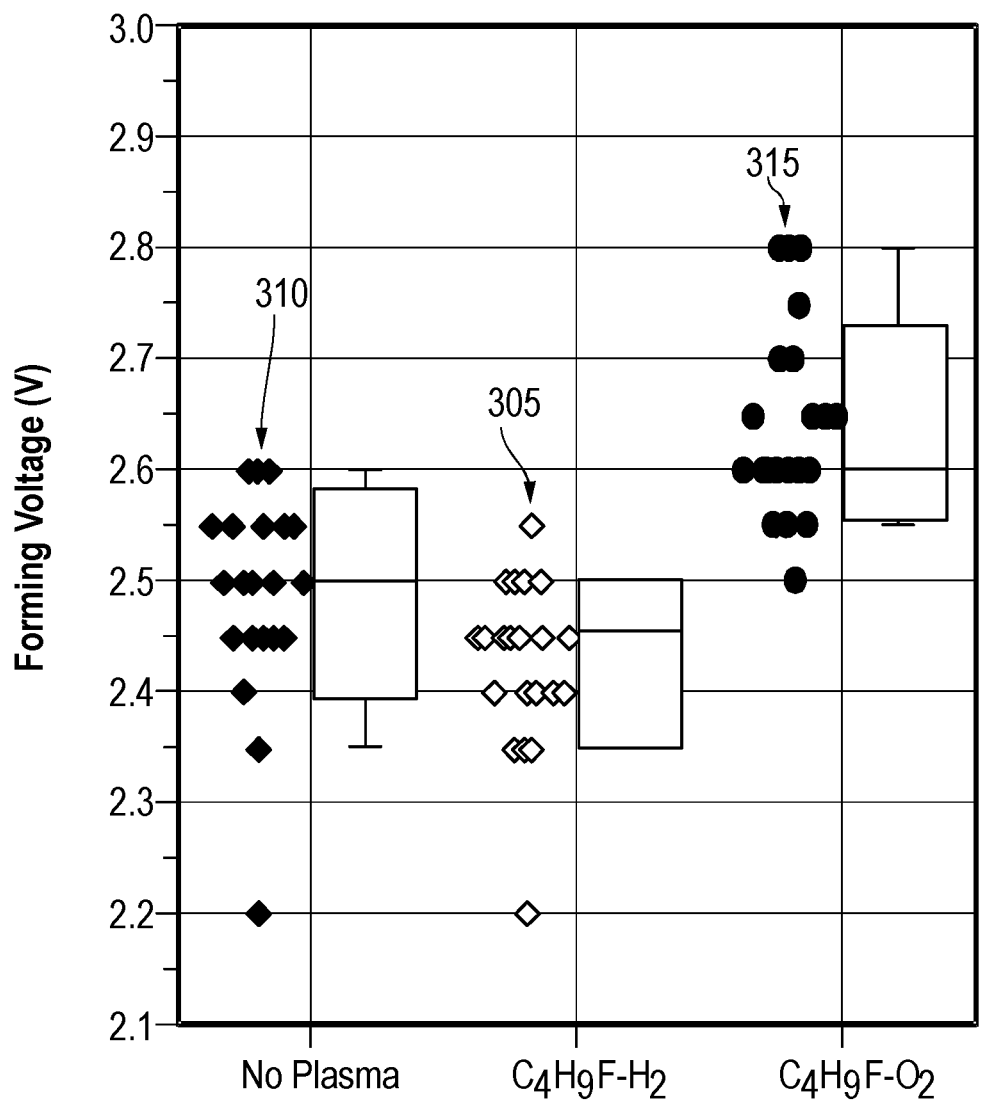
FIG. 3 illustrates exemplary forming voltages of the cell stack comparing no plasma etch and two exemplary plasma etches.

FIG. 3 illustrates exemplary forming voltages of the cell stack with no plasma etch provided and two exemplary plasma etches. More specifically, FIG. 3 illustrates a first grouping 305 of exemplary forming voltages obtained by applying a selected set of operating variables in the ranges mentioned above. The forming voltages of the cell stack with no plasma applied are also shown in FIG. 3, as indicated by the second grouping 310. Further a third grouping 315 of forming voltages is shown that are the forming voltages of the cell stack using an etch having the same conditions as described above for first grouping 305, except replacing the $H_2$ with oxygen ($O_2$). As can be seen from FIG. 3, the use of a plasma etch that is oxygen-free improves the forming voltage characteristics versus the oxygen-included etch. Specifically, the oxygen-included etch results in increased forming voltage characteristics as seen by a comparison of first grouping 305 and third grouping 315. In this manner, it can be seen that the oxygen-free plasma provides improved cell performance compared to the oxygen-containing plasma which degrades the cell performance by increasing the forming voltages. Thus, the RERAM cell switching characteristics are improved when utilizing the oxygen-free plasma etch as compared to the oxygen-containing plasma etch.

Figure 4:
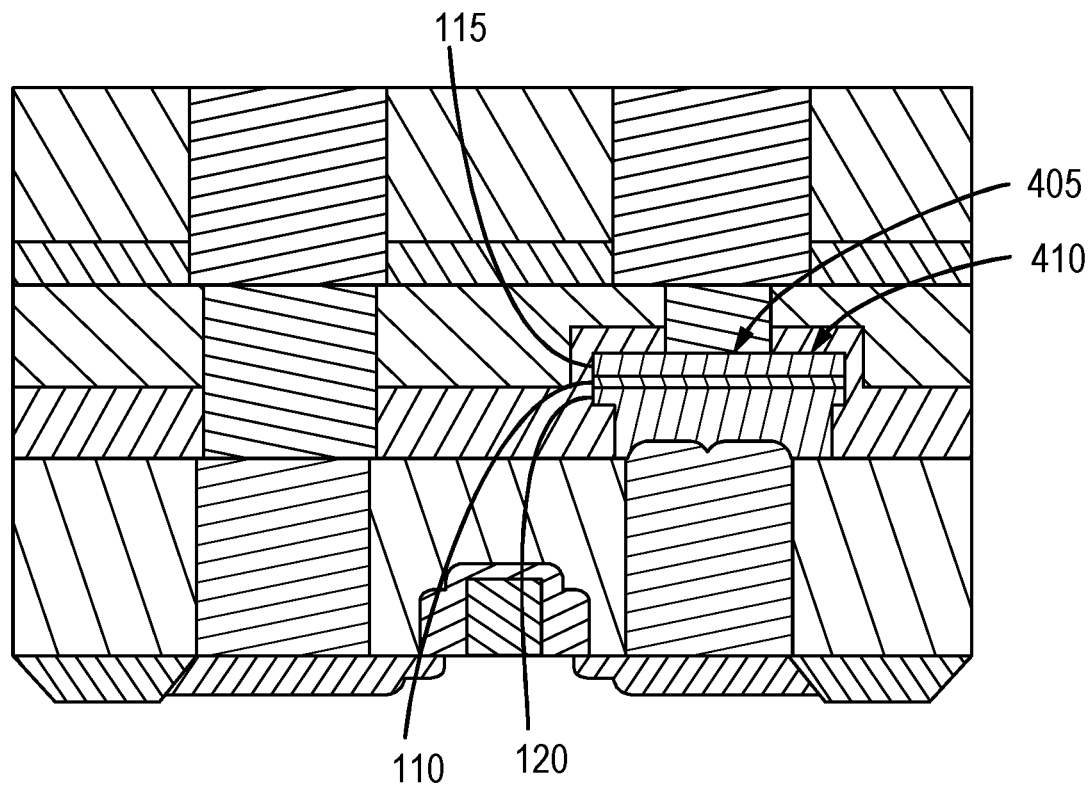
FIG. 4 illustrates regions of a RERAM top electrode that are exposed to a via etch and regions of the RERAM top electrode that are not exposed to the via etch.

The techniques described herein provide a RERAM in which the oxygen concentrations in the top electrode are not affected by exposure to the via etch. Thus, the oxygen concentrations are the same in the via region of the top electrode as compared to other regions of the top electrode. In this manner, regions exposed to the plasma etch are similar to regions not exposed to the plasma etch. FIG. 4 illustrates an exemplary RERAM cell stack such as obtained by the process described with relation to FIGS. 2A-2M. Further, FIG. 4 highlights the locations of regions of the cell stack exposed to the top electrode via plasma etch and the regions of the cell stack not exposed to the top electrode via plasma etch. As shown in FIG. 4, the portion 405 of the top electrode 115 has been exposed to the top electrode via plasma etch (an etch step such as shown in FIG. 2G above). Further, the portion 410 of the top electrode 115 (and similarly other regions outside of the via region) has not been exposed to the top electrode via plasma etch. In accordance with the exemplary techniques described herein, the oxygen concentrations in both portion 405 of the top electrode and portion 410 of the top electrode may be the same because oxygen concentration changes do not result from the top electrode via etch. In this manner, degradation of the forming voltages does not occur based upon oxygen concentration changes caused by the via etch.

In this manner, an RERAM may be formed. The RERAM may comprise a top electrode, a resistive dielectric layer and a bottom electrode. The top electrode may have a via region where a via will contact the top electrode and a non-via region which is not contacted by a via. Oxygen concentrations in the top electrode via regions and the top electrode non-via regions may be substantially similar, and more preferably identical. In this manner, oxygen vacancies in the RERAM cell stack may be controlled. More specifically, the oxygen vacancies are controlled by utilizing oxygen-free plasma etching when the top electrode of the RERAM is exposed to a via plasma etch.

As mentioned above, the techniques described herein may be used to form a variety of RERAMs within a variety of RERAM process flows. The particular composition of the various layers may vary as would be known by those skilled in the art. Thus, other types of materials may be utilized for the various RERAM layers while still obtaining the benefits of the oxygen-free plasma etching techniques described herein.

Figure 5:
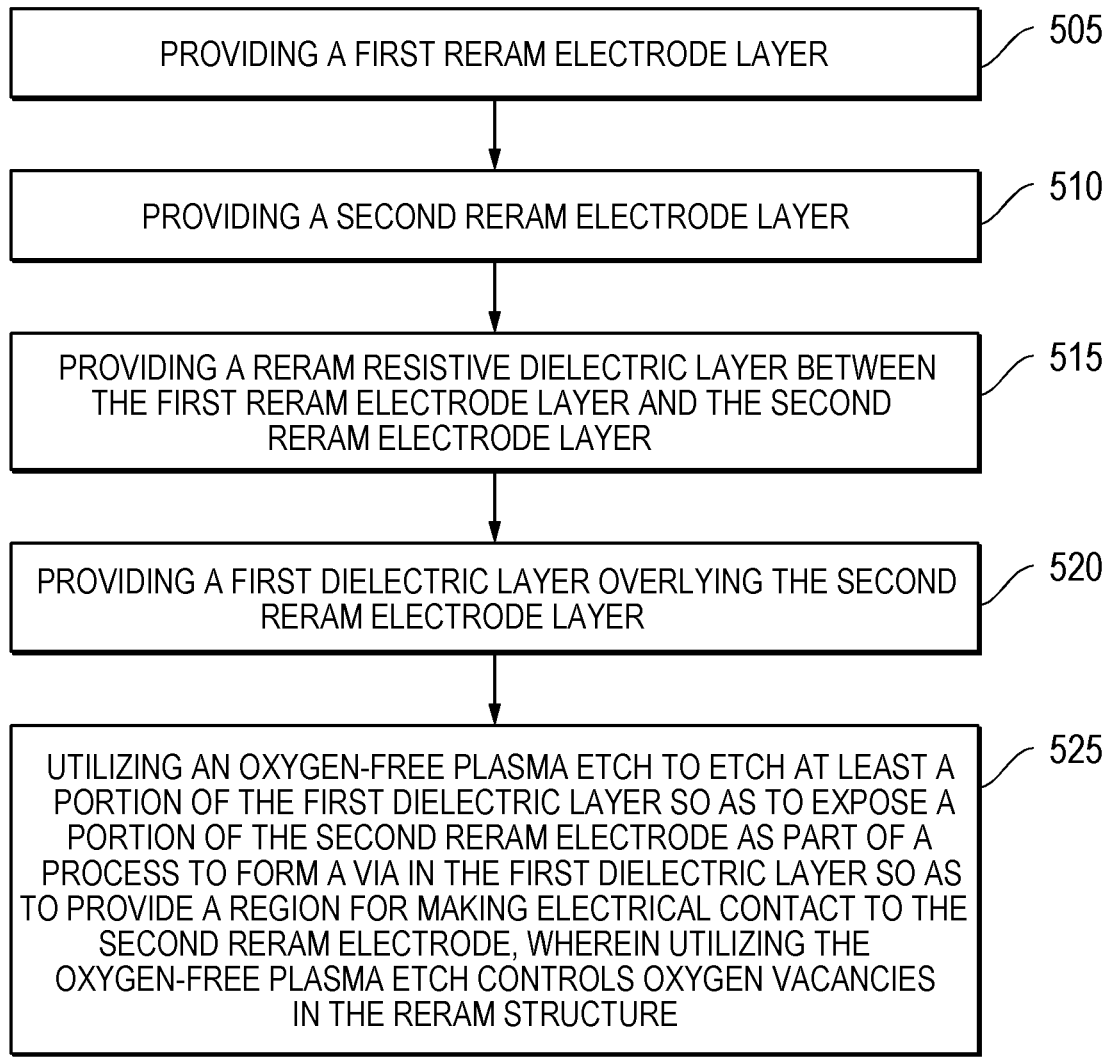
FIGS. 5 and 6 illustrate exemplary embodiments of methods incorporated usage of the concepts described herein.
Figure 6:
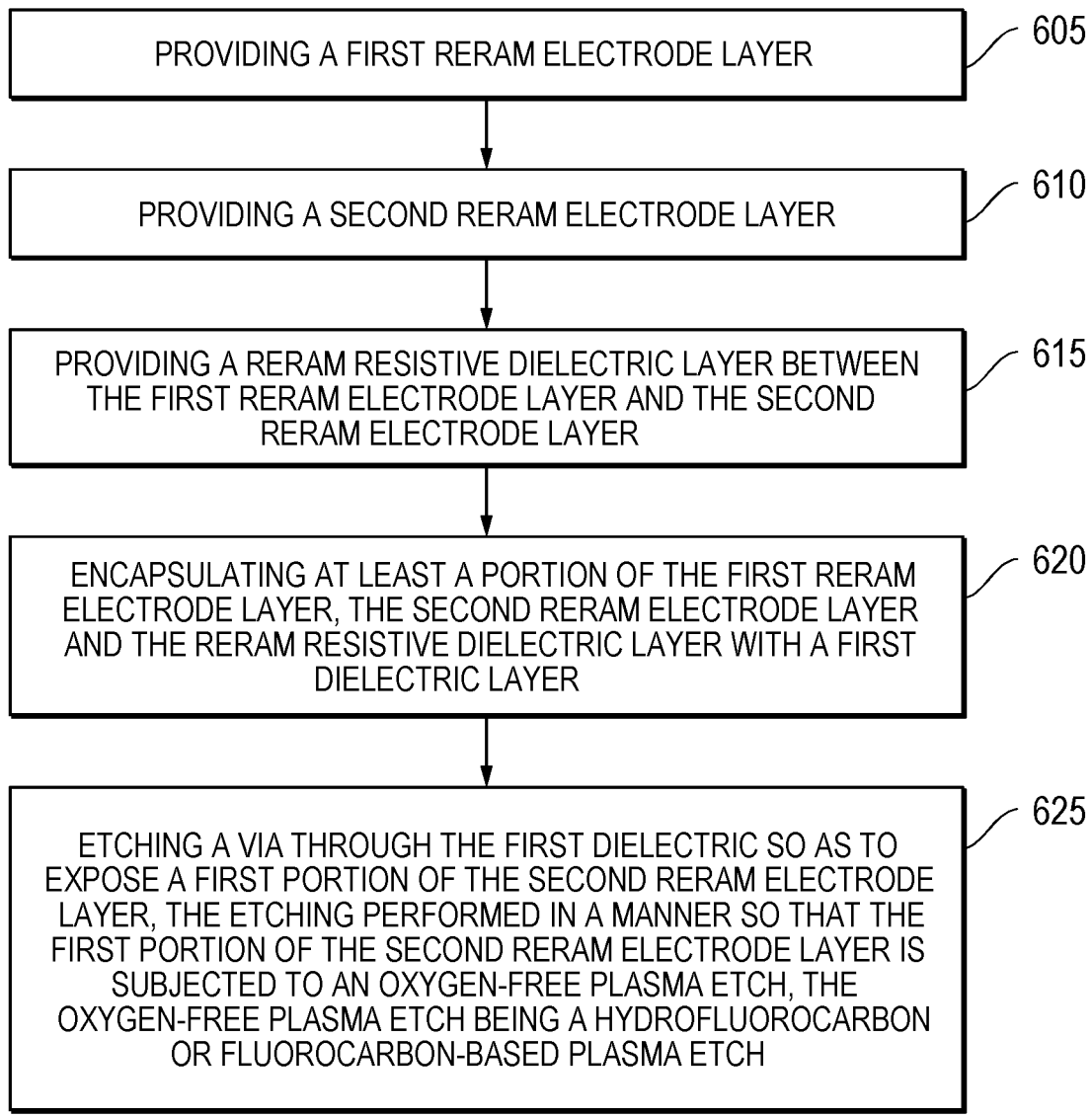

FIGS. 5 and 6 illustrate exemplary methods for use of the processing techniques described herein. It will be recognized that the embodiments of FIGS. 5 and 6 are merely exemplary and additional methods may utilize the techniques described herein. Further, additional processing steps may be added to the methods shown in the FIGS. 5 and 6 as the steps described are not intended to be exclusive. Moreover, the order of the steps is not limited to the order shown in FIGS. 5 and 6 as different orders may occur and/or various steps may be performed in combination or at the same time.

FIG. 5 illustrates a method of forming a resistive random access memory (RERAM) structure. The method comprises step 505 of providing a first RERAM electrode layer, step 510 of providing a RERAM resistive dielectric layer, and step 515 of providing a second RERAM electrode layer, wherein the RERAM resistive dielectric layer is between the first RERAM electrode layer and the second RERAM electrode layer. The method further comprises step 520 of providing a first dielectric layer overlying the second RERAM electrode layer. The method also comprises step 525 of utilizing an oxygen-free plasma etch to etch at least a portion of the first dielectric layer so as to expose a portion of the second RERAM electrode as part of a process to form a via in the first dielectric layer so as to provide a region for making electrical contact to the second RERAM electrode, wherein utilizing the oxygen-free plasma etch controls oxygen vacancies in the RERAM.

FIG. 6 illustrates a method of forming a resistive random access memory (RERAM) structure. The method comprises step 605 of providing a first RERAM electrode layer, step 610 of providing a RERAM resistive dielectric layer and step 615 of providing a second RERAM electrode layer, wherein the a RERAM resistive dielectric layer is between the first RERAM electrode layer and the second RERAM electrode layer. The method further comprises step 620 of encapsulating at least a portion of the first RERAM electrode layer, the second RERAM electrode layer and the RERAM resistive dielectric layer with a first dielectric. The method also includes step 625 of etching a via through the first dielectric so as to expose a first portion of the second RERAM electrode layer, the etching performed in a manner so that the first portion of the second RERAM electrode layer is subjected to an oxygen-free plasma etch, the oxygen-free plasma etch being a hydrofluorocarbon or fluorocarbon-based plasma etch.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken only as exemplary embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of forming a resistive random access memory (RERAM), comprising:
    providing a first RERAM electrode layer;
    providing a RERAM resistive dielectric layer;
    providing a second RERAM electrode layer, wherein the RERAM resistive dielectric layer is between the first RERAM electrode layer and the second RERAM electrode layer;
    providing a first dielectric layer overlying the second RERAM electrode layer;
    utilizing an oxygen-free plasma etch to etch at least a portion of the first dielectric layer so as to expose a portion of the second RERAM electrode as part of a process to form a via in the first dielectric layer so as to provide a region for making electrical contact to the second RERAM electrode; and
    filling the via with a via conductor that extends from the second RERAM electrode layer to a top of the via, the via conductor having (i) a bottom surface that is in direct contact with the second RERAM electrode and (ii) a top surface that is in direct contact with a metal layer at the top of the via,
    wherein utilizing the oxygen-free plasma etch controls oxygen vacancies in the RERAM.

2. The method of claim 1, wherein the RERAM resistive dielectric layer comprises a metal oxide selected from a group of hafnium oxide (HfO), tantalum oxide (TaOx), aluminum oxide (AlOx), zirconium oxide (ZrOx) or titanium oxide (TiOx) and their mixtures.

3. The method of claim 1, the first dielectric layer comprising silicon nitride.

4. The method of claim 3, the RERAM resistive dielectric layer comprising hafnium oxide (HfO), tantalum oxide (TaOx), aluminum oxide (AlOx), zirconium oxide (ZrOx) or titanium oxide (TiOx) and their mixtures.

5. The method of claim 4, the oxygen-free plasma etch being a hydrofluorocarbon or fluorocarbon-based plasma etch.

6. The method of claim 5, the oxygen-free plasma etch being a hydrofluorocarbon-based plasma etch.

7. The method of claim 6, the hydrofluorocarbon comprising $C_4H_9F$.

8. The method of claim 1, the oxygen-free plasma etch being a hydrofluorocarbon or fluorocarbon-based plasma etch.

9. The method of claim 8, the oxygen-free plasma etch being a hydrofluorocarbon-based plasma etch.

10. The method of claim 9, the hydrofluorocarbon comprising $C_4H_9F$.

11. A method of forming a resistive random access memory (RERAM), comprising:
    providing a first RERAM electrode layer;
    providing a RERAM resistive dielectric layer;
    providing a second RERAM electrode layer, wherein the RERAM resistive dielectric layer is between the first RERAM electrode layer and the second RERAM electrode layer;
    encapsulating at least a portion of the first RERAM electrode layer, the second RERAM electrode layer and the RERAM resistive dielectric layer with a first dielectric;

etching a via through the first dielectric so as to expose a first portion of the second RERAM electrode layer, the etching performed in a manner so that the first portion of the second RERAM electrode layer is subjected to an oxygen-free plasma etch, the oxygen-free plasma etch being a hydrofluorocarbon or fluorocarbon-based plasma etch, and filling the via with a via conductor that extends from the second RERAM electrode layer to a top of the via, the via conductor having (i) a bottom surface that is in direct contact with the second RERAM electrode and (ii) a top surface that is in direct contact with a metal layer at the top of the via.

12. The method of claim 11, the first dielectric comprising a silicon nitride.

13. The method of claim 12, the oxygen-free plasma etch being a hydrofluorocarbon-based plasma etch.

14. The method of claim 13, the hydrofluorocarbon comprising $C_4H_9F$.

15. A method of forming a resistive random access memory (RERAM), comprising:

providing a first RERAM electrode layer;

providing a RERAM resistive dielectric layer;

providing a second RERAM electrode layer, wherein the RERAM resistive dielectric layer is between the first RERAM electrode layer and the second RERAM electrode layer;

encapsulating at least a portion of the first RERAM electrode layer, the second RERAM electrode layer and the RERAM resistive dielectric layer with a first dielectric; and etching a via through the first dielectric so as to expose a first portion of the second RERAM electrode layer, the etching performed in a manner so that the first portion of the second RERAM electrode layer is subjected to an oxygen-free plasma etch, the oxygen-free plasma etch being a hydrofluorocarbon or fluorocarbon-based plasma etch, wherein a first oxygen concentration in the first portion of the second RERAM electrode layer is the same as a second oxygen concentration in second portions of the second RERAM electrode layer, the second portions of the second RERAM electrode layer not being exposed to the oxygen-free plasma etch.

16. The method of claim 15, wherein the RERAM resistive dielectric layer comprises hafnium oxide (HfO).

17. The method of claim 1, wherein the first RERAM electrode layer and the second RERAM electrode layer are formed of a same material.

18. The method of claim 1, wherein the second RERAM electrode layer is in direct contact with the RERAM resistive dielectric layer.

19. The method of claim 11, wherein the first RERAM electrode layer and the second RERAM electrode layer are formed of a same material.

20. The method of claim 11, wherein the second RERAM electrode layer is in direct contact with the RERAM resistive dielectric layer.

* * * * *